(12) United States Patent
Liaw et al.

(10) Patent No.: US 6,424,281 B1
(45) Date of Patent: Jul. 23, 2002

(54) DAC WITH ADJUSTING DIGITAL CODES CORRESPONDED TO REFERENCE VOLTAGES

(75) Inventors: Ming-Jiun Liaw, Hsinchu; Yuh-Ren Shen; Chien-Chih Chen, both of Tainen; Yong-Nien Rao, Taichung, all of (TW)

(73) Assignee: Industrial Technology Research Institute (TW)

( * ) Notice: Subject to any disclaimer, the term of this patent is extended or adjusted under 35 U.S.C. 154(b) by 0 days.

(21) Appl. No.: 09/713,933

(22) Filed: Nov. 16, 2000

(51) Int. Cl.[7] .............................................. H03M 1/66
(52) U.S. Cl. ....................... 341/144; 348/674
(58) Field of Search ........................ 341/144; 348/674, 348/675, 677, 694, 696

(56) References Cited

U.S. PATENT DOCUMENTS 5,345,277 A * 9/1994 Blankevoort et al. ....... 348/679
5,990,979 A * 11/1999 Koyama et al. ............. 348/674
6,166,781 A * 12/2000 Kwak et al. ................. 348/674
6,204,882 B1 * 3/2001 Sowig ........................ 348/380

* cited by examiner

Primary Examiner—Peguy JeanPierre
Assistant Examiner—Joseph Lauture (57) ABSTRACT

Disclosed is a DAC (digital/analog converter) with adjustable digital codes corresponding to reference voltages, in which a novel DAC designed with an associated circuit is used in non-linear digital-code-to-voltage transfer applications, so as to provide the display with analog voltage signals. In such a DAC, the Gamma reference voltages as well as the corresponding digital codes are adjustable. It provides a greater degree of freedom for the realization of the correction of Gamma parameters so as to fit the curve representing the transfer function of the destination digital codes and the voltages required by the data driver and to precisely implement the digital-code-to-voltage transfer function.

27 Claims, 9 Drawing Sheets

DAC WITH ADJUSTING DIGITAL CODES CORRESPONDED TO REFERENCE VOLTAGES

BACKGROUND OF THE INVENTION

1. Field of the Invention

The present invention generally relates to a DAC (digital/analog converter) with adjusting digital codes corresponded to reference voltages, and more particularly, to a system in which a novel DAC designed with an associated circuit is used in non-linear digital-code-to-voltage transfer applications.

2. Description of the Prior Art

Recently, the technique in the field of displays has grown rapidly with the fast development in opto-electronics. However, for a display (a television having a conventional picture tube, a state-of-the-art thin film transistor-liquid crystal display or a plasma display panel), the realization of the correction of Gamma parameters has become a major factor of the image quality.

Figure 1:
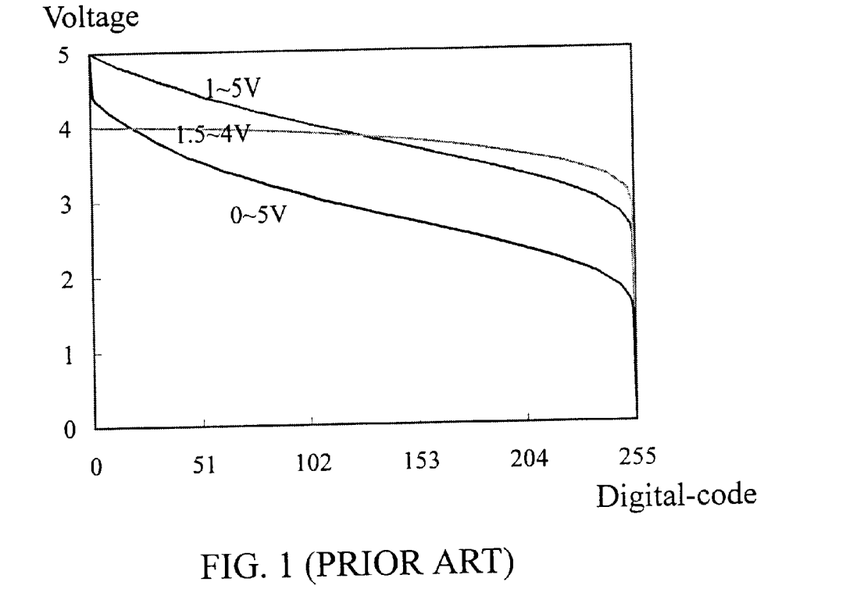
FIG. 1 is a graph illustrating the variation of the conventional digital-code-to-voltage transfer curve required for the data driver of the display, in which the digital-code-to-voltage transfer curve moves with respect to a fixed Gamma reference voltage.

Gamma correction is achieved by the digital-code-to-voltage transfer function of the internal DAC of a data driver. However, the digital-code-to-voltage transfer function for Gamma correction is influenced not only by the opto-electronic characteristics but also by the coding of the image and the users' settings so that it may exhibit different destination curves. Please refer to FIG. 1, which is a graph illustrating the variation of the digital-code-to-voltage transfer curve required for the data driver of the display, in which the digital-code-to-voltage transfer curve moves with respect to the adjustable Gamma reference voltages. As shown in the drawing, as the minimum driving voltage varies, different digital-code-to-voltage transfer curves can be obtained. For example, if it is given a driving voltage range of 1~5V, the obtained digital-code-to-voltage transfer curve is different from the digital-code-to-voltage transfer curve obtained when it is given a driving voltage range of 1~5V.

Figure 2:
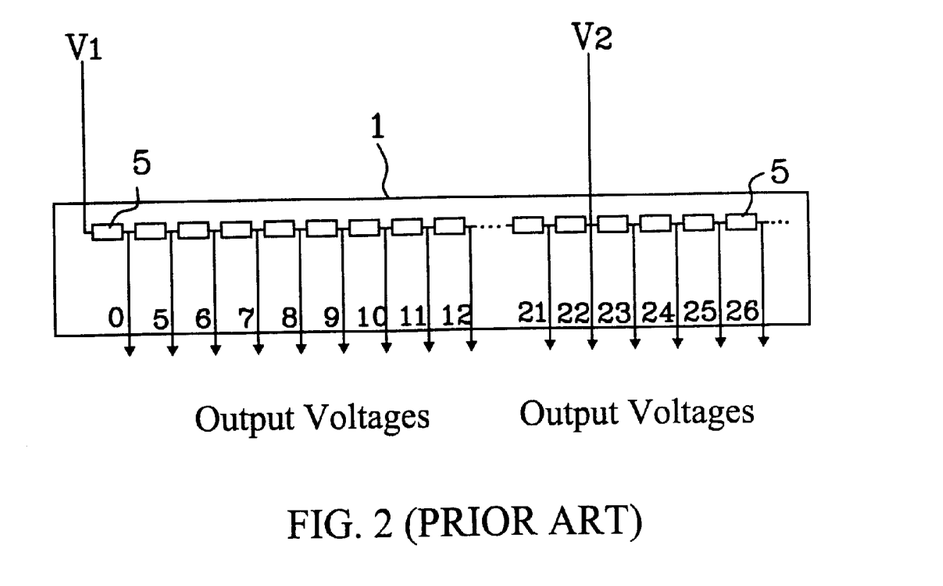
FIG. 2 is a schematic circuit diagram of a conventional digital/analog voltage dividing circuit.
Figure 3A:
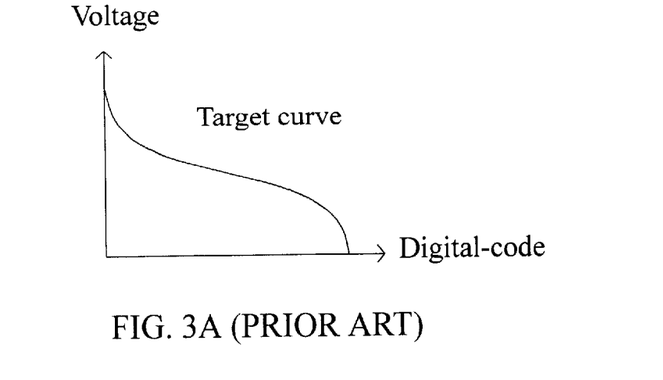
FIG. 3 shows two graphs illustrating the digital-code-to-voltage transfer curves of a conventional digital/analog voltage dividing circuit, wherein the voltage value is adjustable but the corresponding digital codes are not adjustable.
Figure 3B:
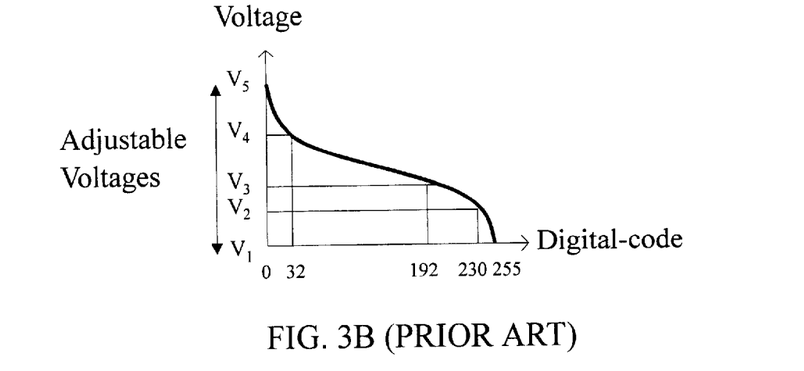

The internal DAC of a state-of-the-art data driver generates different digital-code-to-voltage transfer curves by changing the reference voltage values. The voltage dividing circuit used in the prior art is shown in FIG. 2, in which the voltage dividing circuit 1 is composed of a plurality of voltage dividers 5 and the output voltages are constant. The typical digital-code-to-voltage transfer curve is as shown in FIGS. 3A and 3B. In general, the corresponding digital codes are not adjustable, and the different digital-code-to-voltage transfer functions can only be implemented by changing the reference voltages. Taking FIG. 3B for example, the Gamma reference voltages range ($V_1$~$V_5$) are adjustable with the corresponding digital codes (0, 32, 192, 230, and 255) fixed.

However, such a conventional technique, as shown in FIGS. 2 and 3, has one major setback: small degree of freedom in implementing the digital-code-to-voltage transfer function. The digital codes with respect to the external Gamma reference voltages of the data driver used in the mentioned conventional techniques are fixed. This reduces the degree of freedom for the realization of the correction of Gamma parameters and leads to greater difference of the transfer curve and the destination function. As a result, the image quality of the display is adversely affected.

It is mainly due to the fact that the relation between the digital codes and the signal voltages as well as the relation between the digital code and the luminance of a display are non-linear, and such non-linearity must be corrected by using Gamma parameters, so that the signal voltages and the digital codes or the luminance can meet the requirement of linearity and thus high image quality can be obtained. Accordingly, to overcome the non-linear characteristics in the prior art, the present invention provides a novel DAC circuit in which the digital signals are converted into analog signals before being delivered into the display, so as to improve the image quality.

SUMMARY OF THE INVENTION

In order to overcome the problem in the prior art, it is thus the primary object of the present invention to provide a DAC (digital/analog converter) with adjustable digital codes corresponding to reference voltages, in which a novel DAC designed with an associated circuit is used in non-linear digital-code-to-voltage transfer applications, so as to provide the display with analog voltage signals. In such a DAC, the Gamma reference voltages as well as the corresponding digital codes are adjustable. It provides a greater degree of freedom for the realization of the correction of Gamma parameters so as to fit the curve representing the transfer function of the destination digital codes and the voltages required by the data driver and to precisely implement the digital-code-to-voltage transfer function.

The present invention also provides a voltage dividing circuit not only applicable to the Gamma correction system but also suitable for use in other non-linear transfer applications.

In order to achieve the foregoing object, the present invention provides a DAC with adjustable digital codes corresponding to reference voltages, comprises: a plurality of programmable switches, receiving different reference voltages respectively and operating under the control of a switch control unit; a switch controller, connecting the output terminals of the plurality of programmable switches and voltage dividers with corresponding digital codes according to the corresponding digital code signals from a signal source, so as to apply the reference voltages to the digital codes; a digital/analog voltage dividing circuit, composed of a plurality of voltage dividers serially connected, wherein the input terminals of the digital/analog voltage dividing circuit are connected to the plurality of programmable switches, so as to output a plurality of voltage values of the digital codes with respect to the reference voltages according to the switch controller; and an output voltage selecting unit, connected to the output terminals of the digital/analog voltage dividing circuit, so as to select a series of voltage dividing points and deliver a set of voltage values to the output terminal when the number of the voltage dividing points is larger than the number of the output voltages.

It is preferable that the voltage dividers are composed of capacitors, resistors, or a combination of both capacitors and resistors.

It is preferable that each of said plurality of output voltage selecting unit selects and outputs a set of proper divided voltages when the number of divided voltages is larger than the actual number of the output voltages. Wherein each gamma reference voltage except the first and last ones is connected to two programmable switches to select the two corresponding voltage dividing points according to said switch controller. And then each of said plurality output voltage selecting unit can select a set of proper voltage outputs and can skip some voltage dividing points as so to meet the requirement that the number of divided voltages is larger than the actual number of the output voltages.

It is preferable that the first voltage and the last voltage are connected to only one individual switch, so as to select the corresponding voltage dividing points with respect to the reference voltages.

It is preferable that the corresponding digital codes with respect to the $m_{th}$ and the $(m+1)_{th}$ reference voltages are adjacent, non-adjacent, or alternating.

It is preferable that the output voltage selecting unit is implemented by a front-end output voltage selecting unit and a back-end output voltage selecting unit.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention provides a DAC (digital/analog converter) with adjustable digital codes corresponding to reference voltages, in which a novel DAC designed with an associated circuit is used in non-linear digital-code-to-voltage transfer applications, so as to provide the display with analog voltage signals. In such a DAC, the Gamma reference voltages as well as the corresponding digital codes are adjustable, as shown in FIG. 4.

Figure 4:
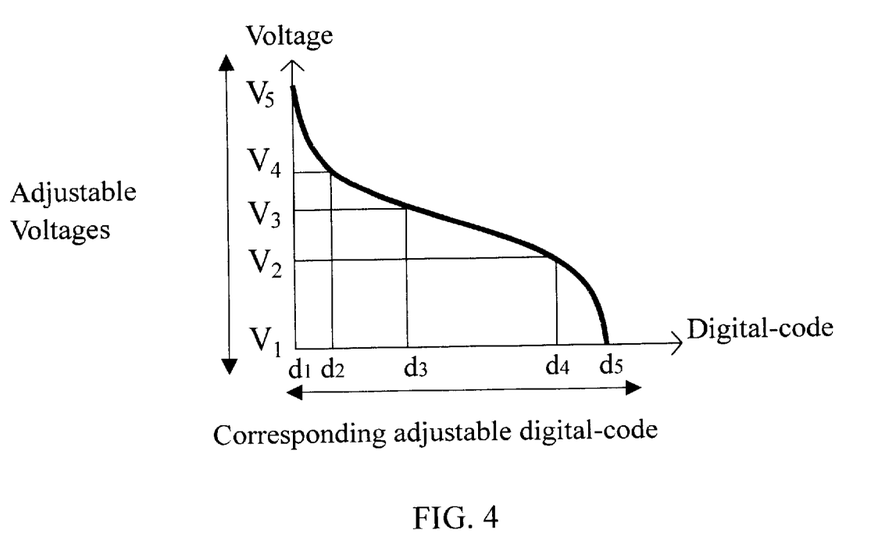
FIG. 4 is a graph illustrating a digital-code-to-voltage transfer curve in accordance with the first embodiment of the present invention, wherein both the voltages and the digital codes are adjustable, so as to realize different destination digital-code-to-voltage transfer curves.
Figure 5:
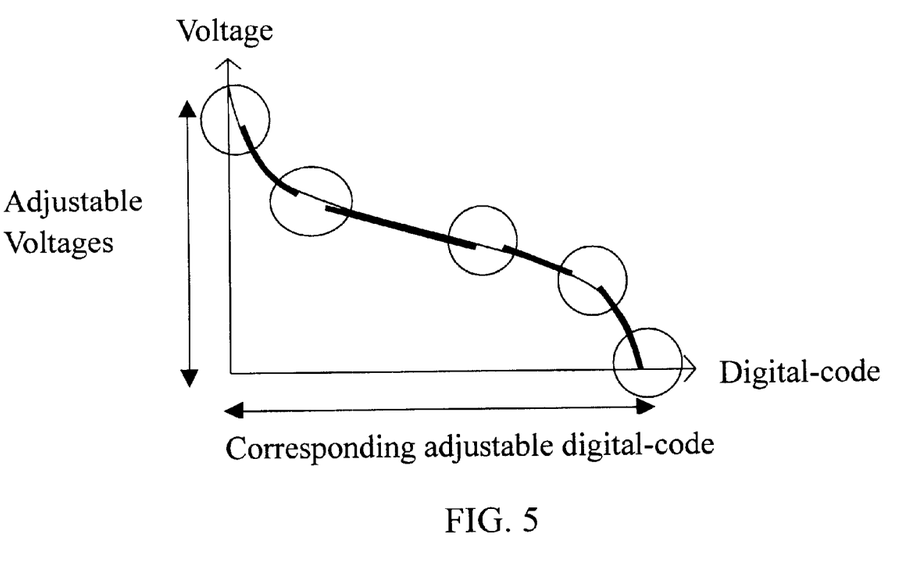
FIG. 5 is a graph illustrating a second digital-code-to-voltage transfer curve in accordance with the second embodiment of the present invention.

Please refer to FIG. 4, which is a graph illustrating a digital-code-to-voltage transfer curve in accordance with one embodiment of the present invention, wherein both the voltages and the digital codes are adjustable, so as to realize different destination digital-code-to-voltage transfer curves. As shown in FIG. 4, there are five adjustable reference voltages $V_1$, $V_2$, $V_3$, $V_4$, $V_5$ and five corresponding adjustable digital-code $d_1$, $d_2$, $d_3$, $d_4$, $d_5$. Moreover, FIG. 5 is a graph illustrating a second digital-code-to-voltage transfer curve in accordance with one embodiment of the present invention. As shown in FIG. 5, there are four pieces of bold lines with five turning points (or referred to as "voltage dividing points" as circled). In other words, the number of the voltage dividing points is larger than the number of corresponding digital codes. Therefore, different destination curves as well as different pieces of the curves can be determined by changing the voltage values and the corresponding digital codes.

The major difference of these two cases is the number of divided voltages. For an N-bit system, the first digital-code-to-voltage transfer method (as shown in FIG. 4) results in $2^N$ divided voltages output into a data driver, and the second digital-code-to-voltage transfer method (as shown in FIG. 5) results in at least $2^N$ divided voltages, among which only $2^N$ divided voltages (shown as the bold lines) are selected to be output into the data driver. Therefore, according to the present invention, a greater degree of freedom for the realization of the correction of gamma parameters is obtained, so as to exhibit the digital-code-to-voltage transfer function curve representing the transfer function of the destination digital codes and the voltages required by the data driver.

Figure 6:
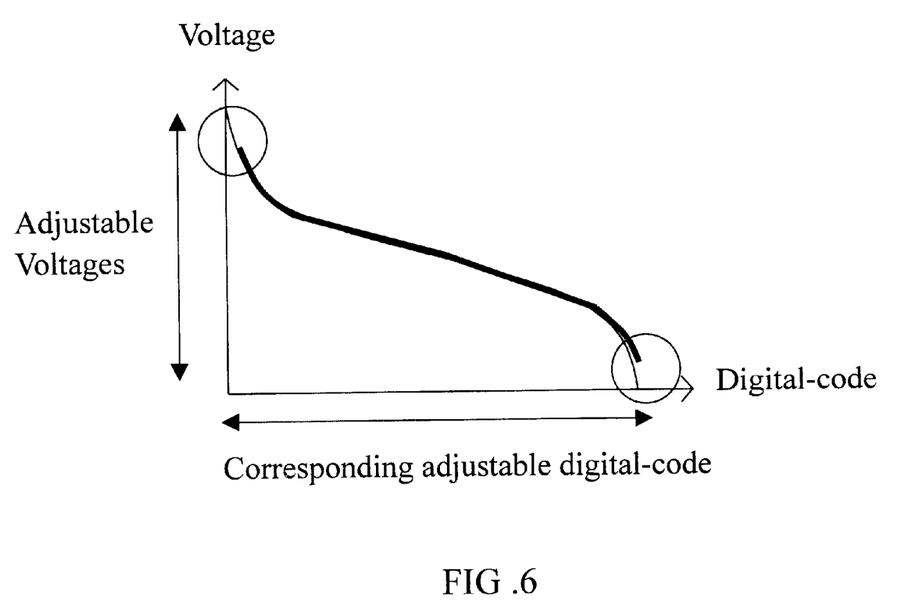
FIG. 6 is a graph illustrating a third digital-code-to-voltage transfer curve in accordance with the third embodiment of the present invention.

Please further refer to FIG. 6, which is a graph illustrating a third digital-code-to-voltage transfer curve in accordance with the third embodiment of the present invention. This is a special case of FIG. 5. For displays from mass production, the voltage-to-luminance curves are almost identical so that it is possible to perform the digital-code-to-voltage transfer on the voltage-to-luminance curves. When luminance and contrast are being adjusted, the digital-code-to-voltage transfer function only has to be shifted within a certain range. The major advantage of the case is that only two external Gamma reference voltages are required.

Figure 7:
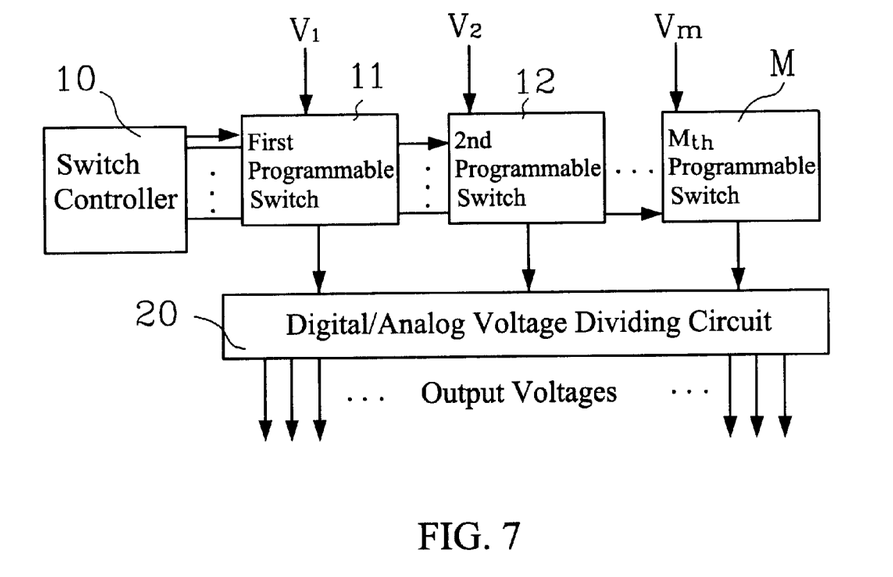
FIG. 7 is a schematic circuit diagram in association with FIG. 4, illustrating a DAC with adjustable digital codes corresponding to reference voltages in accordance with the first embodiment of the present invention.
Figure 8:
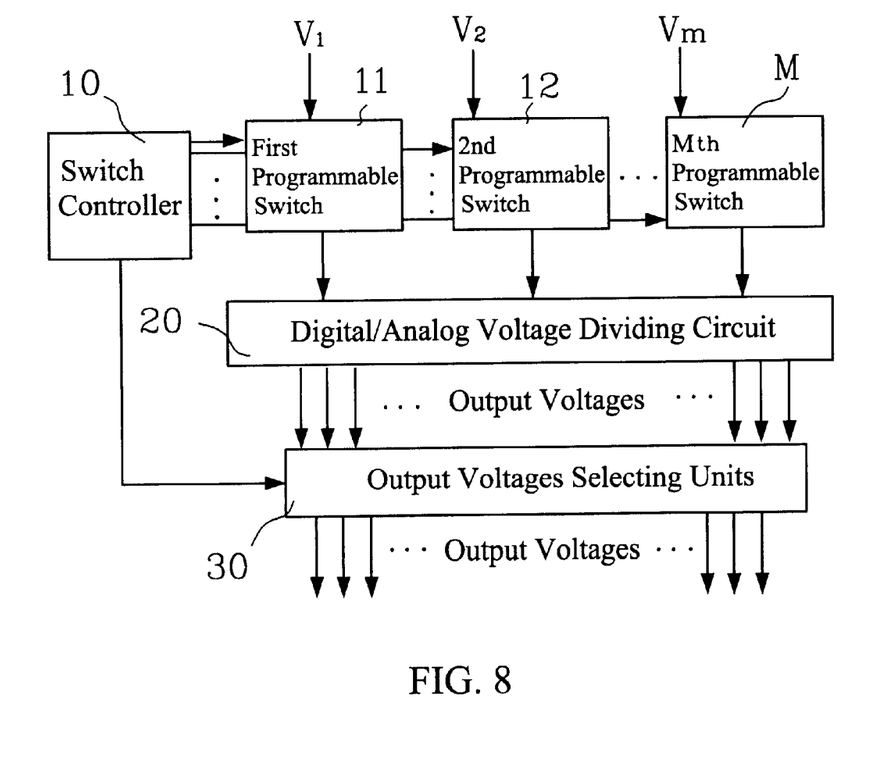
FIG. 8 is a schematic circuit diagram in association with FIG. 5, illustrating a DAC with adjustable digital codes corresponding to reference voltages in accordance with the second embodiment of the present invention.

Please refer to FIG. 7, which is a schematic circuit diagram in association with FIG. 4, illustrating a DAC with adjustable digital codes corresponding to reference voltages in accordance with the first embodiment of the present invention. The circuit configuration of the DAC comprises: a plurality of programmable switches 11, 12 . . . M; a controlling unit, i.e., a switch controller 10; and a digital/analog voltage dividing circuit 20. However, the circuit configuration of FIG. 7 only represents a basic structure, and a preferred embodiment is shown in FIG. 8. FIG. 8 is a schematic circuit diagram in association with FIG. 5, illustrating a DAC with adjustable digital codes corresponding to reference voltages in accordance with the second embodiment of the present invention. The circuit configuration of the DAC comprises: a plurality of programmable switches, namely, a first switch 11, a second switch 12 . . . and an $m_{th}$ switch M, receiving different reference voltages $V_1$, $V_2$ . . . $V_m$, respectively and operating under the control of a switch control unit 10.

For a voltage-transitivity function, different digital-code-to-voltages transfer curves may be obtained with different voltage range (according to the adjustment on the display). However, according to our practical research, the corresponding digital codes with respect to the turning points of the transfer curves are very close, which only requires a few programmable switches disposed for certain digital codes. Therefore, it is necessary only to install a switch adjacent to a certain gray-scale value so that the present invention only needs a limited number of programmable switches. Of course, the programmable switches can also be continuously disposed if needed.

Moreover, the switch controller 10 connects the output terminals of the plurality of programmable switches 11, 12 . . . M and voltage dividers with corresponding digital codes according to the corresponding digital code signals from a signal source, so as to apply the reference voltages $V_1$, $V_2$ . . . $V_m$ to the digital codes. The voltage dividers are composed of capacitors, resistors, or a combination of both capacitors and resistors. The signal source can be implemented by using a central process unit.

Figure 10:
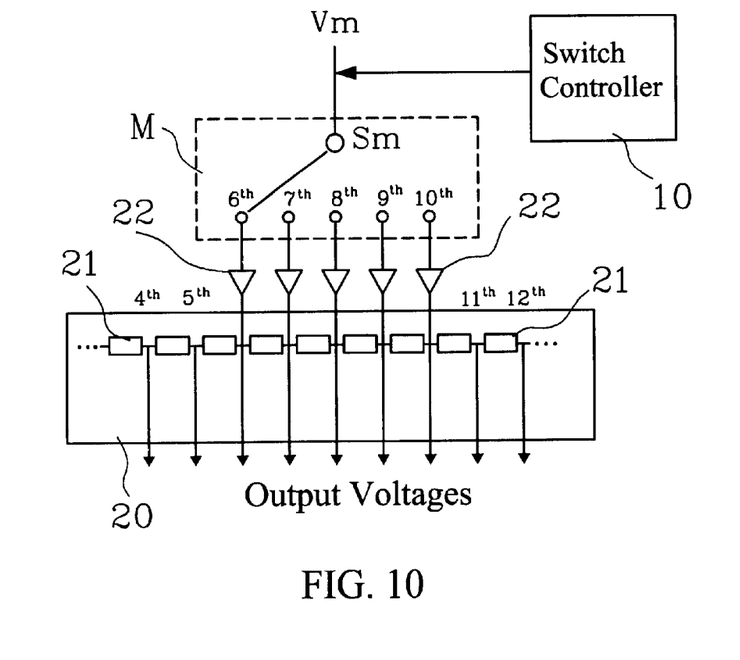
FIG. 10 is a detailed circuit of the schematic circuit diagram as shown in FIG. 7 in accordance with the first embodiment of the present invention.

Furthermore, the digital/analog voltage dividing circuit 20 is composed of a plurality of voltage dividers 21 serially connected (as shown in FIG. 10). Wherein the input terminals of the digital/analog voltage dividing circuit are connected to the plurality of programmable switches, so as to output a plurality of voltage values of the digital codes with respect to the reference voltages according to the switch controller 10. For an N-bit system, the digital/analog voltage dividing circuit 20 generates at least $2^N$ divided voltages. The input terminals of the digital/analog voltage dividing circuit 20 select the proper voltage dividing points and are connected to the output terminals of the programmable switches. So as to exhibit the digital-code-to-voltage transfer function curve representing the transfer function of the destination digital codes and the voltages required by the data driver. Therefore, the digital/analog voltage dividing circuit 20 is characterized in that: (1) any two of the Gamma reference voltages can be linear or non-linear; (2) the transfer functions of different reference voltages can be different; and (3) the voltage dividing circuit at the boundary can be alternatively designed so that the divided voltages can meet the requirement of the different transfer functions on the both sides of the boundary.

As shown in FIG. 8, the number of the voltage dividing points is larger than the number of the output voltages, therefore a plurality of output voltage selecting units 30 are required. Such each output voltage selecting unit 30 is connected to the output terminals of the digital/analog voltage dividing circuit 20, so as to select a series of voltage dividing points and deliver a set of voltage values to the output terminal when the number of the voltage dividing points is larger than the number of the output voltages. Each output voltage selecting unit 30 can be implemented by using programmable switches. And also, the output terminals of the each output voltage selecting unit are connected to buffers, so as to drive the next stage.

Figure 9:
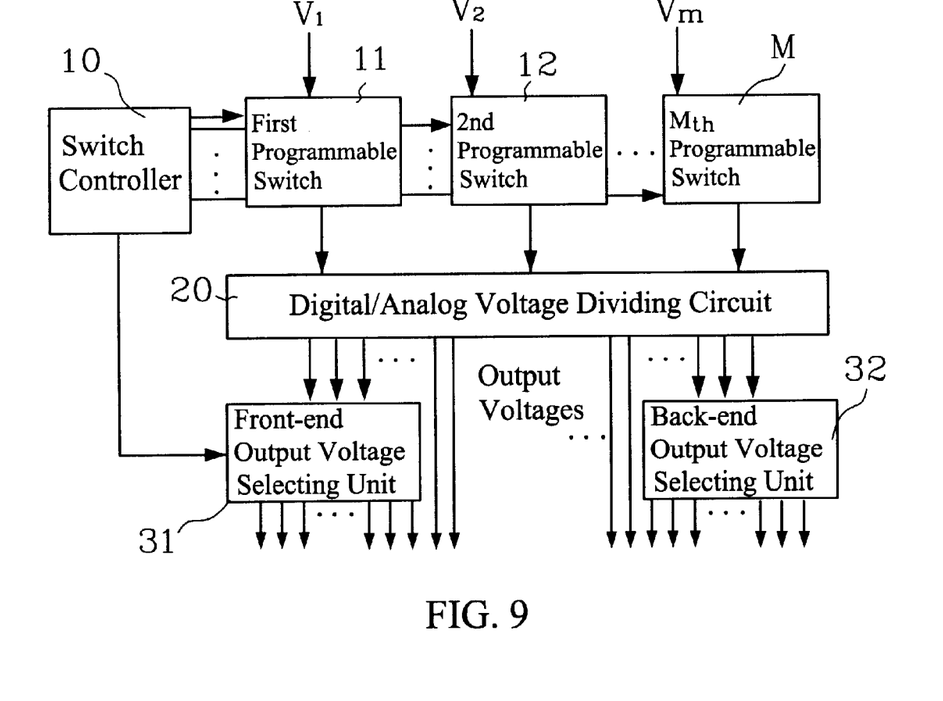
FIG. 9 is a schematic circuit diagram in association with FIG. 6, illustrating a DAC with adjustable digital codes corresponding to reference voltages in accordance with the third embodiment of the present invention.

Please refer to FIG. 9, which is a schematic circuit diagram in association with FIG. 6, illustrating a DAC with adjustable digital codes corresponding to reference voltages in accordance with the third embodiment of the present invention. Such a system only has to select the output voltages at both ends. The output voltages in the central portion always have a common operating voltage range, for example the linear region of a voltage-to-luminance curve, no matter how the luminance and the contrast are adjusted. The common operating voltage range can be automatically can be directly connected and output at the voltage dividing points, without being selected. For an 8-bit system, if it is given 300 voltages provided by the voltage dividing points, the central 200 voltage dividing points are directly connected and output to the next stage, without having a connected switch. Among the remained 100 voltages (50 voltages at both sides, respectively), 28 voltages have to be selected.

In FIG. 9, the circuit configuration of the DAC also comprises: a plurality of programmable switches 11, 12 . . . M, receiving different reference voltages $V_1$, $V_2$ . . . $V_m$, respectively and operating under the control of a switch control unit 10. The switch controller 10 connects to the output terminals of the plurality of programmable switches 11, 12 . . . M and voltage dividers with corresponding digital codes according to the corresponding digital code signals from a signal source. So as to apply the reference voltages $V_1, V_2 \ldots V_m$ to the digital codes. The digital/analog voltage dividing circuit 20 is composed of a plurality of voltage dividers 21 serially connected, wherein the input terminals of the digital/analog voltage dividing circuit are connected to the plurality of programmable switches 11, 12 . . . M, so as to output a plurality of voltage values of the digital codes with respect to the reference voltages according to the switch controller 10.

Comparing the embodiment as shown in FIG. 9 and the embodiment as shown in FIG. 8, the major difference is that the former has a front-end output voltage selecting unit 31 and a back-end output voltage selecting unit 32 in instead of the plurality of output voltage selecting units. The front-end output voltage selecting unit 31 is connected to the front-end output terminals of the digital/analog voltage dividing circuit 20. When the number of the voltage dividing points is larger than the number of the output voltages, a series of voltage dividing points are selected to connect the voltages to the front-end voltage output terminal. The back-end output voltage selecting unit 32 is connected to the back-end output terminals of the digital/analog voltage dividing circuit 20. When the number of the voltage dividing points is larger than the number of the output voltages, a series of voltage dividing points are selected to connect the voltages to the back-end voltage output terminal. On the other hand, the output terminals of the front-end output voltage selecting unit 31 and the back-end output voltage selecting unit 32 are connected to the buffers, so as to drive the next stage.

Similarly, the voltage dividers are composed of capacitors, resistors, or a combination of both capacitors and resistors. The signal source can be implemented by using a central process unit. When the circuit configuration as shown in FIG. 9 is used in a correction system for displays, for a N-bit system, the digital/analog voltage dividing circuit 20 can at least output N voltages. The front-end output voltage selecting unit 31 and the back-end output voltage selecting unit 32 can be implemented by using programmable switches.

Please refer to FIG. 10, which is a detailed circuit of the schematic circuit diagram as shown in FIG. 7 in accordance with the first embodiment of the present invention. The voltage dividing points of the external reference voltages can be controlled by using the switch controller. In order to overcome the problem related to the turn-on resistance of the $m_{th}$ switch M, the external reference voltages can be divided by the voltage dividers 21 (composed of resistors, capacitors or both resistors and capacitors). The number of the voltage dividing points is equal to the number of the output voltages, the output terminals of the voltage dividing circuit can be directly connected to the voltage dividing points, without an output voltage selecting unit.

Figure 11:
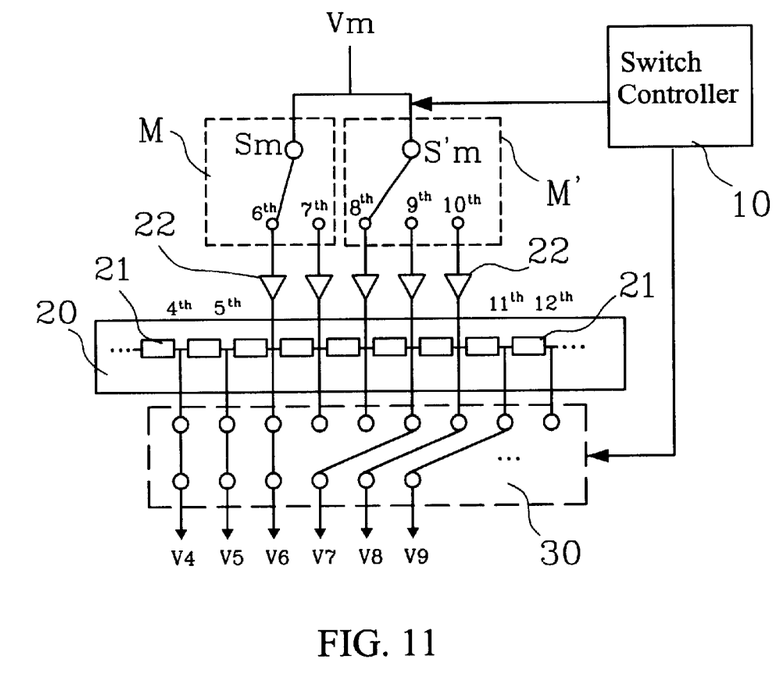
FIG. 11 is a detailed circuit of the schematic circuit diagram as shown in FIG. 8 in accordance with the second embodiment of the present invention.

Please refer to FIG. 11, which is a detailed circuit of the schematic circuit diagram as shown in FIG. 8 in accordance with the second embodiment of the present invention. In this case, the number of divided voltages is larger than the actual number of the out voltages. Therefore, each output voltage selecting unit 30 is needed to switch and select the divided voltages. The input terminals of the digital/analog voltage dividing circuit 20 are not continuously selected (as the bold lines shown in FIG. 5). Therefore, if both ends of the each selected piece of the curve are connected to individual reference voltages as those shown in FIG. 10, the number of reference voltages has to be increased. Alternatively, the realization of the input terminals as shown in FIG. 11 does not need additional reference voltages since both ends of the each selected piece of the curve are connected to the same reference voltage.

In FIG. 11, there are provided buffers interposed between the programmable switches M, M' and each of the voltage dividers 21. Alternatively, each output terminal of the digital/analog voltage dividing circuit 20 is connected to a buffer. It is also possible to provide buffers at the output terminals of the output voltage selecting units 30 $V_4$, $V_5$, $V_6$, $V_7$, $V_8$, $V_9$, so as to drive the next stage.

Figure 12:
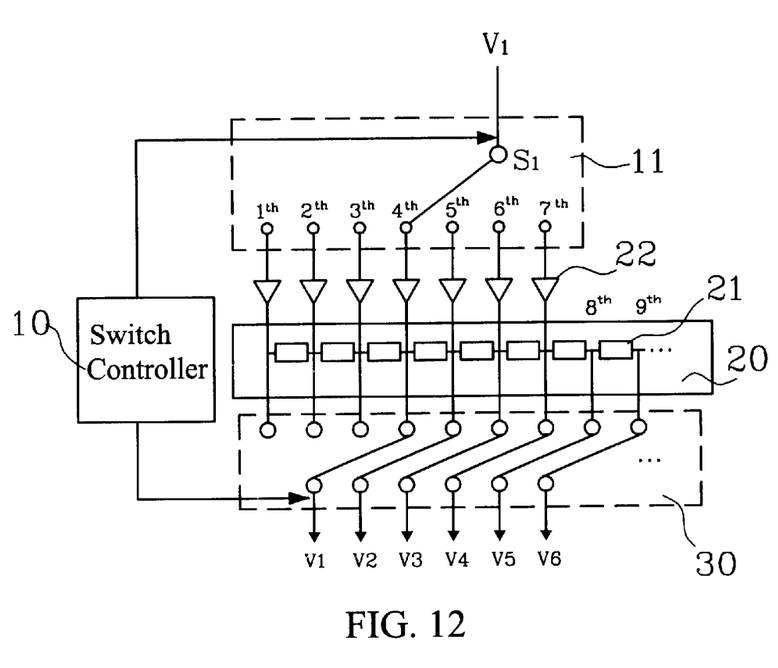
FIG. 12 is another detailed circuit of the schematic circuit diagram as shown in FIG. 8 in accordance with the second embodiment of the present invention.

Please refer to FIG. 12, which is another detailed circuit of the schematic circuit diagram as shown in FIG. 8 in accordance with the second embodiment of the present invention. In the drawing, the realization of the first reference voltage, the last reference voltage and the digital/analog voltage dividing circuit 20 can be further simplified. At the output terminals of the left portion of the digital/analog voltage dividing circuit 20 ($1^{th}$, $2^{th}$, $3^{th}$), there is only provided a first switch 11 to switch and select a series of voltage dividing points with respect to the reference voltages.

Figure 13:
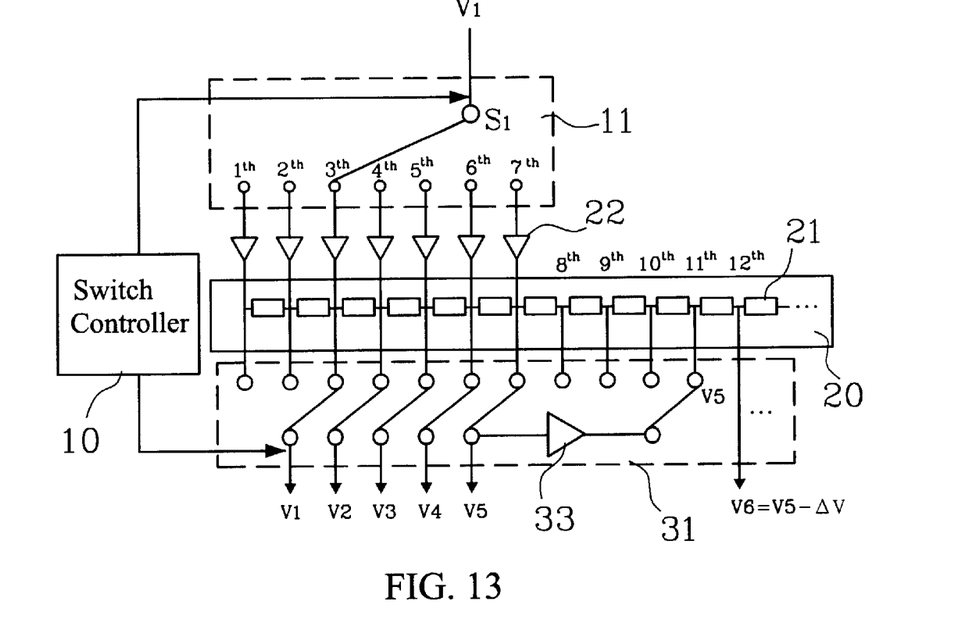
FIG. 13 is a detailed circuit of the schematic circuit diagram as shown in FIG. 9 in accordance with the third embodiment of the present invention.

FIG. 13 is a detailed circuit of the schematic circuit diagram as shown in FIG. 9 in accordance with the third embodiment of the present invention. It generally relates to the operation of the front-end output voltage selecting unit 31 and the back-end output voltage selecting unit 32 (where the front-end output voltage selecting unit 31 is used as an example in the drawing). When the number of divided voltages is larger than the actual number of the output voltages, appropriate divided voltages are selected to be output by the switching function provided by the front-end output voltage selecting unit 31 and the back-end output voltage selecting unit 32. For the first and the last reference voltages respectively, a switch is used (as exemplified by the switch 11 in the drawing) to be controlled by using a switch controller 12 in combination with the front-end output voltage selecting unit 31 and the back-end output voltage selecting unit 32, so that the voltages at some voltage dividing points are not selected as so to meet the requirement that the number of divided voltages is larger than the actual number of output voltages.

For detailed description of FIGS. 13, 5 out of 11 divided voltages are selected to be $V_1$~$V_5$, and $V_6$ corresponds to the 12th voltage dividing point. If the first switch 11 (with respect to switching point $S_1$) denotes the voltage of the lowest digital code, $V_1$, the switching point $S_1$ can only be selected from $V_1$~$V_7$. When $S_1$ is selected to be 7, $V_1$~$V_5$ denote the voltages at the 8th to 11th voltage dividing points, respectively, adjacent to the voltage dividing point of $V_6$. When $S_1$ is not selected to be 7, as shown in FIG. 13, $V_1$~$V_5$ denote the voltages at the 3th to 7th voltage dividing points, respectively. In order to make the voltage dividing points of $V_5$ and $V_6$ adjacent to each other (so that the transfer-code-to-voltage transfer function can be smooth), $V_5$ must be connected to the voltage dividing point in front of the voltage dividing point of $V_6$ (i.e., the 11th voltage dividing point). If necessary, $V_5$ can be connected to the 11th voltage dividing point by way of a buffer 33.

Figure 14:
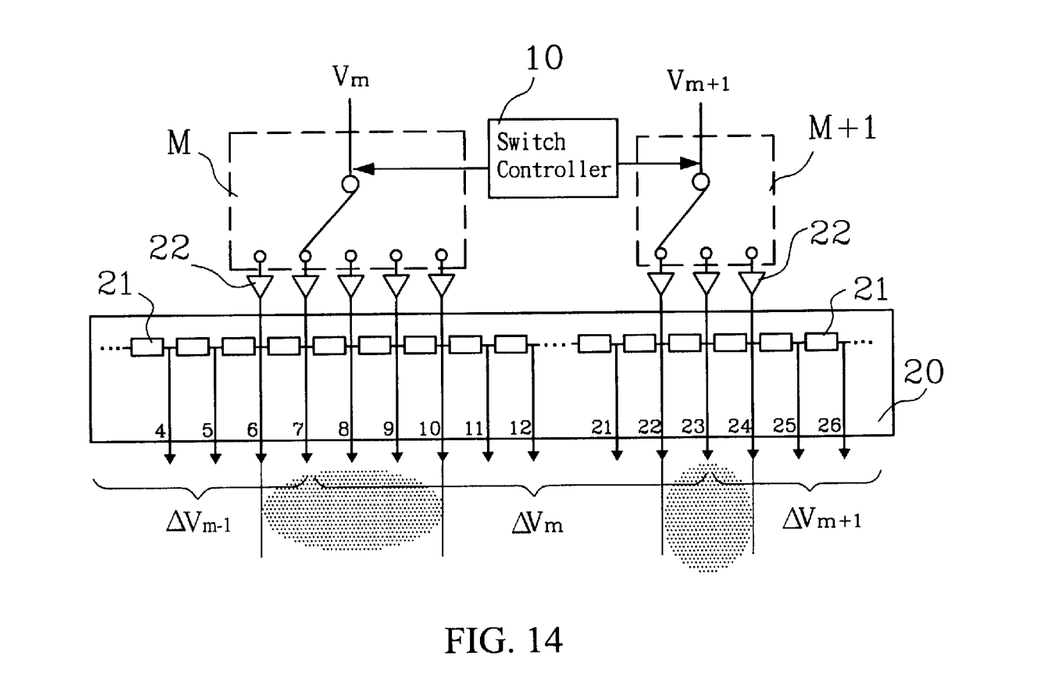
FIG. 14 is a circuit for the description of a series of voltage dividing points in accordance with one embodiment of the present invention.

On the other hand, the precision problem of the divided voltages at the voltage dividing points (turning points) will be discussed hereinafter. The voltage dividing points corresponding to the turning points on the digital-code-to-voltage curve are adjustable, while the resistances or capacitances related to the divided voltages between two outputs are fixed. Therefore, there is a problem related to the output voltages at the selected voltage dividing points (as shown in FIG. 14, which is a circuit for the description of voltage dividing points in accordance with one embodiment of the present invention.) as stated below:

When the $m_{th}$ reference voltage is selected to be at the 7th voltage dividing point, the difference of the output voltage $\Delta V_{56}=\Delta V_{67}\neq\Delta V_{78}$, and when the next $m_{th}$ reference voltage is selected to be at the 6th voltage dividing point, the difference of the output voltage $\Delta V_{56}=\Delta V_{67}\neq\Delta V_{78}$. However, the resistances or capacitances related to the divided voltages between two outputs are fixed, therefore the fore-mentioned conditions cannot be followed. Fortunately, such a problem does not affect the Gamma correction operation of the display too adversely according to the actual simulated results.

Figure 15A:
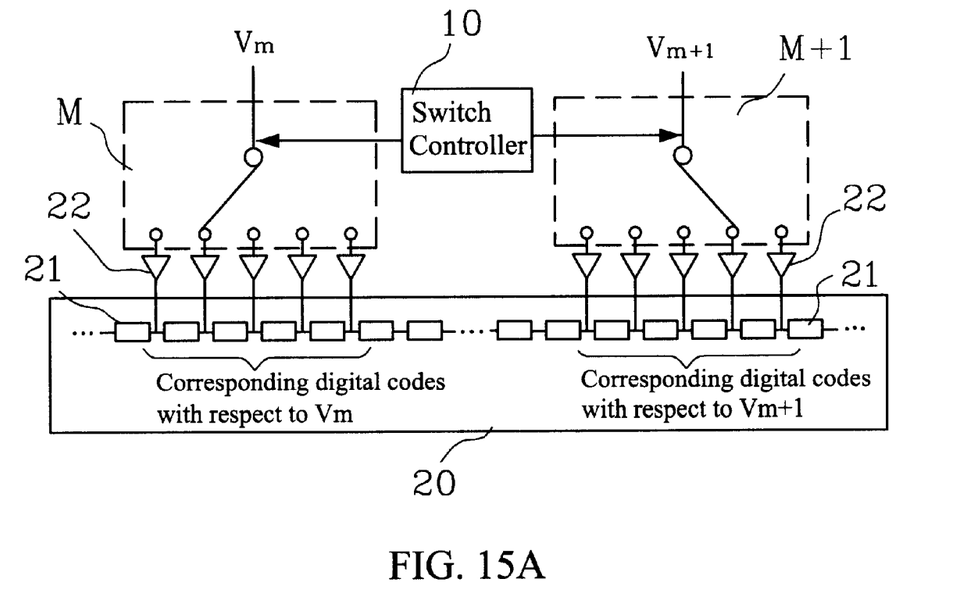
FIG. 15A is a circuit for the description of a case in which the corresponding digital codes with respect to the $m_{th}$ and the $(m+1)_{th}$ reference voltages are not adjacent in accordance with one embodiment of the present invention.
Figure 15B:
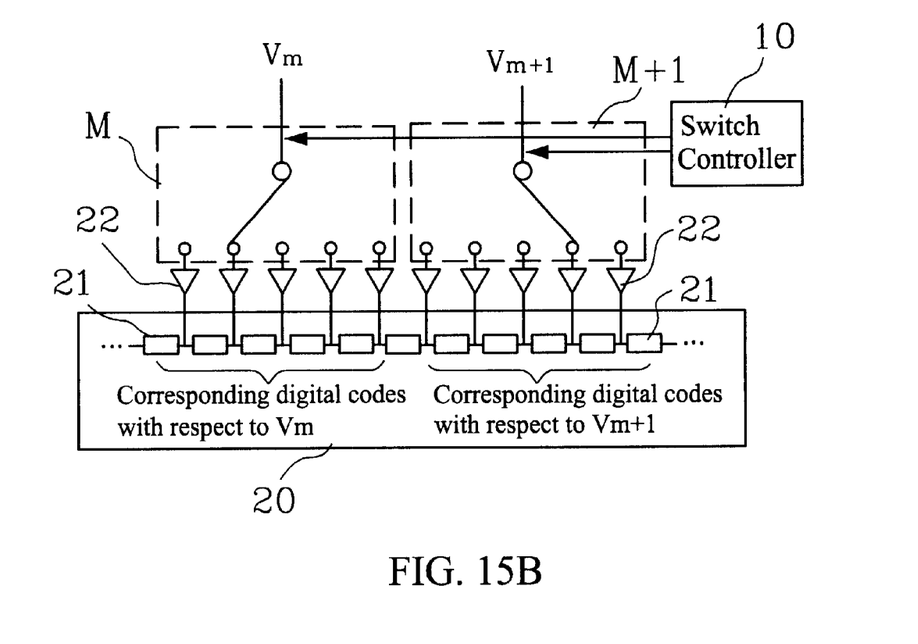
FIG. 15B is a circuit for the description of a case in which the corresponding digital codes with respect to the $m_{th}$ and the $(m+1)_{th}$ reference voltages are adjacent in accordance with one embodiment of the present invention.
Figure 15C:
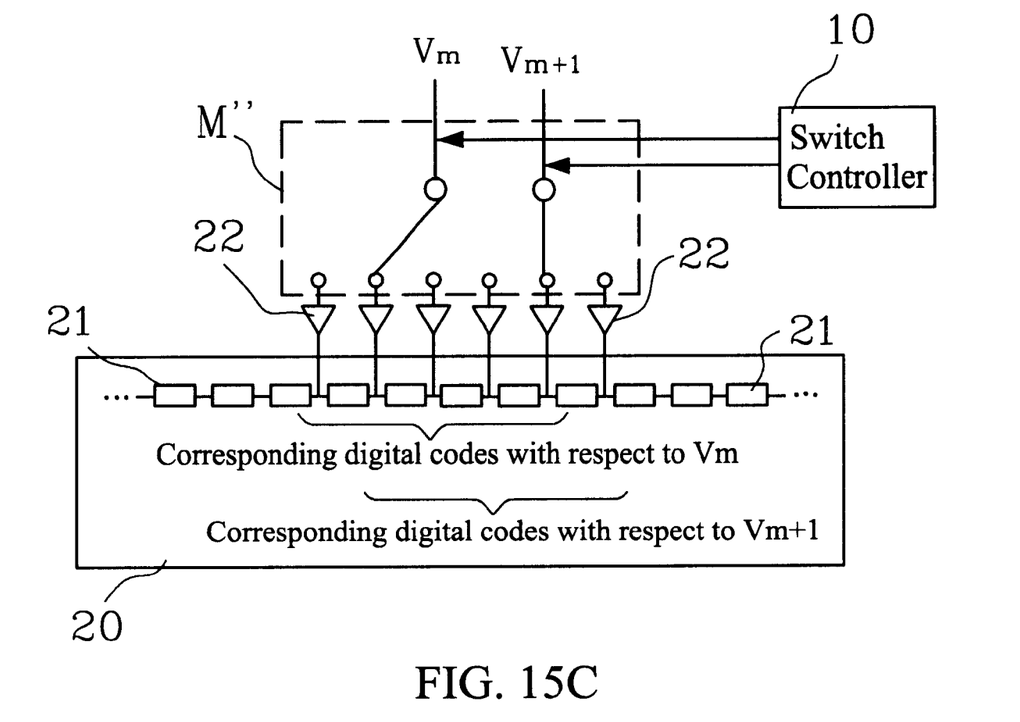
FIG. 15C is a circuit for the description of a case in which the corresponding digital codes with respect to the $m_{th}$ and the $(m+1)_{th}$ reference voltages are alternating in accordance with one embodiment of the present invention.

Please refer to FIGS. 15A, 15B, and 15C, which illustrate the embodiment as shown in FIG. 11 in association with FIG. 8 and the embodiment as shown in FIG. 13 in association with FIG. 9. To be more specific, FIG. 15A is a circuit for the description of a case in which the corresponding digital codes with respect to the $m_{th}$ and the $(m+1)_{th}$ reference voltages are not adjacent; FIG. 15B is a circuit for the description of a case in which the corresponding digital codes with respect to the mth and the $(m+1)_{th}$ reference voltages are adjacent; and FIG. 15C is a circuit for the description of a case in which the corresponding digital codes with respect to the $m_{th}$ and the $(m+1)_{th}$ reference voltages are alternating.

In summary, compared with the prior art, the present invention provides advantageous characteristics as stated below:

1) The digital codes corresponding to the external reference voltages of the data driver are adjustable, which provides a larger degree of freedom in the realization of the transfer-code-to-voltage transfer function.

2) The voltage dividing circuit between any two Gamma voltages obtains accurate results by using linear voltage dividing circuit, so that the voltage dividing circuit for a data driver can be simplified.

3) Compared with the voltage dividing circuit of the data driver of a conventional R-DAC, the present invention uses a multi-segment transfer method to obtain an accurate non-linear transfer-code-to-voltage transfer function. It provides great flexibility in applications under difference conditions. The conventional method for voltage dividing utilizes multi-nonlinear transfer, as shown in the different transfer curves in FIG. 1, which provides poor flexibility. Such a conventional method requires a large chip area for IC implementation. Below is shown the non-linear transfer between two reference voltages:

$c$=[22, 37, 52, 63, 74, 82, 90, 98, 106, 111, 116, 121, 126, 131, 136, 140, 144, 148, 152, 156, 160, 164, 168, 171, 174, 177, 180, 183, 186, 189]/192

$V_n = V_1 + c(V_2 - V_1)$

Assume the required area for voltage difference (3/192, the difference of the last two elements) with highest precision is A, then the total resistor area required for the conventional DAC is 63A(189/3). However, for the novel DAC, the total resistor area required is only 30A (because there are 30 voltages differences), half as large as the original required area.

4) In the voltage dividing circuit of the data driver of a conventional C-DAC, the transfer of any two Gamma voltages is linear, however, it may lead to more noise due to the continuous charging/discharging of the voltage dividing circuit. Therefore, the present invention uses a multi-segment transfer method for the realization of a non-linear transfer-code-to-voltage transfer function by voltage division by using resistor or voltage division by using capacitors. In order to eliminate the noise, voltage division by using resistors may be used to realize the linear-transfer of any two Gamma voltages, so as to prevent noise.

As discussed so far, in accordance with the present invention, there is provided a DAC (digital/analog converter) with adjustable digital codes corresponding to reference voltages, in which a novel DAC designed with an associated circuit is used in non-linear digital-code-to-voltage transfer applications, so as to provide the display with analog voltage signals. In such a DAC, the Gamma reference voltages as well as the corresponding digital codes are adjustable Consequently, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A DAC with adjustable digital codes corresponding to reference voltages, comprising:
    a voltage dividing circuit having a plurality of voltage dividers that are serially connected to each other, each voltage divider having an output terminal;
    a plurality of programmable switches, each receiving different reference voltages, and each having an output terminal that is directly coupled to one of the plurality of voltage dividers;
    a switch control unit that is coupled to said plurality of programmable switches and controls the connection between the programmable switches and the voltage dividers based on digital codes that correspond to corresponding digital code signals from a signal source;
    wherein the voltage dividers output a plurality of voltage values of the digital codes with respect to the reference voltages as controlled by said switch controller; and
    a plurality of output voltage selecting units, each connected to the output terminal of a voltage divider, so as to select a series of voltage dividing points and to deliver a set of voltage values.

2. The DAC with adjustable digital codes corresponding to reference voltages as recited in claim 1, wherein said voltage dividers are composed of resistors.

3. The DAC with adjustable digital codes corresponding to reference voltages as recited in claim 1, wherein said voltage dividers are composed of capacitors.

4. The DAC with adjustable digital codes corresponding to reference voltages as recited in claim 1, wherein said voltage dividers are composed of both capacitors and resistors.

5. The DAC with adjustable digital codes corresponding to reference voltages as recited in claim 1, wherein said signal source is a central process unit.

6. The DAC with adjustable digital codes corresponding to reference voltages as recited in claim 1, wherein, for a N-bit system, said digital/analog voltage dividing circuit can output at least $2^N$ voltages.

7. The DAC with adjustable digital codes corresponding to reference voltages as recited in claim 1, wherein said output voltage selecting units are implemented by using a set of programmable switches.

8. The DAC with adjustable digital codes corresponding to reference voltages as recited in claim 1, wherein a buffer is interposed between each of said plurality of programmable switches and each of said voltage dividers.

9. The DAC with adjustable codes corresponding to reference voltages as recited in claim 1, wherein said output voltage selecting unit has output terminals which are connected to buffers.

10. The DAC with adjustable digital codes corresponding to reference voltages as recited in claim 1, wherein each of said plurality of output voltage selecting unit selects and outputs a set of proper divided voltages when the number of divided voltages is larger than the actual number of the output voltages; wherein each gamma reference voltage except the first and last ones is connected to two programmable switches to select the two corresponding voltage dividing points according to said switch controller, and then each of said plurality output voltage selecting unit can select a set of proper voltage outputs and can skip some voltage dividing points as so to meet the requirement that the number of divided voltages is larger than the actual number of the output voltages.

11. The DAC with adjustable digital codes corresponding to reference voltages as recited in claim 10, wherein the first voltage and the last voltage are connected to only one individual switch, so as to select the corresponding voltage dividing points with respect to the reference voltages.

12. The DAC with adjustable digital codes corresponding to reference voltages as recited in claim 1, wherein the corresponding digital codes with respect to the $m_{th}$ and the $(m+1)_{th}$ reference voltages are adjacent.

13. The DAC with adjustable digital codes corresponding to reference voltages as recited in claim 1, wherein the corresponding digital codes with respect to the $m_{th}$ and the $(m+1)_{th}$ reference voltages are not adjacent.

14. The DAC with adjustable digital codes corresponding to reference voltages as recited in claim 1, wherein the corresponding digital codes with respect to the $m_{th}$ and the $(m+1)_{th}$ reference voltages are alternating.

15. A DAC with adjustable digital codes corresponding to reference voltages, comprising:
   a voltage dividing circuit having a plurality of voltage dividers that are serially connected to each other, each voltage divider having an output terminal;
   a plurality of programmable switches, each receiving different reference voltages, and each having an output terminal that is directly coupled to one of the plurality of voltage dividers;
   a switch control unit that is coupled to said plurality of programmable switches and controls the connection between the programmable switches and the voltage dividers based on digital codes that correspond to corresponding digital code signals from a signal source;
   wherein the voltage dividers output a plurality of voltage values of the digital codes with respect to the reference voltages as controlled by said switch controller;
   a front-end output voltage selecting unit, connected to the output terminal of one or more voltage dividers, so as to select a series of voltage dividing points and to deliver a set of voltage values; and
   a back-end output voltage selecting unit, connected to the output terminal of one or more voltage dividers, so as to select a series of voltage dividing points and to deliver a set of voltage values.

16. The DAC with adjustable digital codes corresponding to reference voltages as recited in claim 15, wherein said voltage dividers are composed of resistors.

17. The DAC with adjustable digital codes corresponding to reference voltages as recited in claim 15, wherein said voltage dividers are composed of capacitors.

18. The DAC with adjustable digital codes corresponding to reference voltages as recited in claim 15, wherein said voltage dividers are composed of both capacitors and resistors.

19. The DAC with adjustable digital codes corresponding to reference voltages as recited in claim 15, wherein said signal source is a central process unit.

20. The DAC with adjustable digital codes corresponding to reference voltages as recited in claim 15, wherein, for a N-bit system, said digital/analog voltage dividing circuit can output at least $2^N$ voltages.

21. The DAC with adjustable digital codes corresponding to reference voltages as recited in claim 15, wherein said front-end output voltage selecting unit and said back-end output voltage selecting unit are implemented by using a set of programmable switches.

22. The DAC with adjustable digital codes corresponding to reference voltages as recited in claim 15, wherein a buffer is interposed between each of said plurality of programmable switches and each of said voltage dividers.

23. The DAC with adjustable digital codes corresponding to reference voltages as recited in claim 1, wherein said front-end output voltage selecting unit and said back-end output voltage selecting unit have output terminals which are connected to buffers.

24. The DAC with adjustable digital codes corresponding to reference voltages as recited in claim 15, wherein said front-end output voltage selecting unit and said back-end output voltage selecting unit switch to select and output two sets of proper divided voltages when the number of divided voltages is larger than the actual number of the output voltages; wherein two sets of programmable switches for the first and the last voltages can be disposed to switch according to said switch controller and said front-end output voltage selecting unit and said back-end output voltage selecting unit, so that the voltages at some voltage dividing points are not selected as so to meet the requirement that the number of divided voltages is larger than the actual number of the output voltages.

25. The DAC with adjustable digital codes corresponding to reference voltages as recited in claim 15, wherein the corresponding digital codes with respect to the $m_{th}$ and the $(m+1)_{th}$ reference voltages are adjacent.

26. The DAC with adjustable digital codes corresponding to reference voltages as recited in claim 15, wherein the corresponding digital codes with respect to the $m_{th}$ and the $(m+1)_{th}$ reference voltages are not adjacent.

27. The DAC with adjustable digital codes corresponding to reference voltages as recited in claim 15, wherein the corresponding digital codes with respect to the $m_{th}$ and the $(m+1)_{th}$ reference voltages are alternating.

* * * * *